(12) United States Patent
Wu

(10) Patent No.: US 12,721,051 B2
(45) Date of Patent: Aug. 25, 2026

(54) PHASE-CHANGE RANDOM ACCESS MEMORY DEVICE AND METHODS OF MAKING THE SAME

(71) Applicant: Taiwan Semiconductor Manufacturing Company Limited, Hsinchu (TW)

(72) Inventor: Jau-Yi Wu, Zhubei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 368 days.

(21) Appl. No.: 18/589,112

(22) Filed: Feb. 27, 2024

(65) Prior Publication Data

US 2024/0206351 A1 Jun. 20, 2024

Related U.S. Application Data

(63) Continuation of application No. 17/826,350, filed on May 27, 2022, now Pat. No. 11,950,518, which is a continuation of application No. 16/785,023, filed on Feb. 7, 2020, now Pat. No. 11,349,070.

(51) Int. Cl.

| | |
|---|---|
| ***H10N 70/20*** | (2023.01) |
| ***G11C 13/00*** | (2006.01) |
| ***H10B 63/00*** | (2023.01) |
| ***H10N 70/00*** | (2023.01) |

(52) U.S. Cl.

CPC ....... *H10N 70/231* (2023.02); *G11C 13/0004* (2013.01); *G11C 13/003* (2013.01); *H10B 63/30* (2023.02); *H10N 70/021* (2023.02); *H10N 70/826* (2023.02); *H10N 70/8828* (2023.02); *G11C 2213/79* (2013.01)

(58) Field of Classification Search

CPC ........ H10N 70/231–235; H10N 70/826–8265; H10N 70/8828

See application file for complete search history.

(56) References Cited

U.S. PATENT DOCUMENTS

2013/0026438 A1 1/2013 Wang et al.
2020/0006645 A1* 1/2020 Cheng .................. H10N 70/043
2021/0249592 A1 8/2021 Wu

* cited by examiner

*Primary Examiner* — Daniel P Shook

(74) *Attorney, Agent, or Firm* — The Marbury Law Group, PLLC

(57) ABSTRACT

A phase-change memory device and method of manufacturing the same, the memory device including: a substrate; a bottom electrode disposed over the substrate; a top electrode disposed over the bottom electrode; and a phase-change layer disposed between the top and bottom electrodes. The phase change layer includes a chalcogenide Ge—Sb—Te (GST) material that includes at least 30 at % Ge and that is doped with a dopant including N, Si, Sc, Ga, C, or any combination thereof.

20 Claims, 5 Drawing Sheets

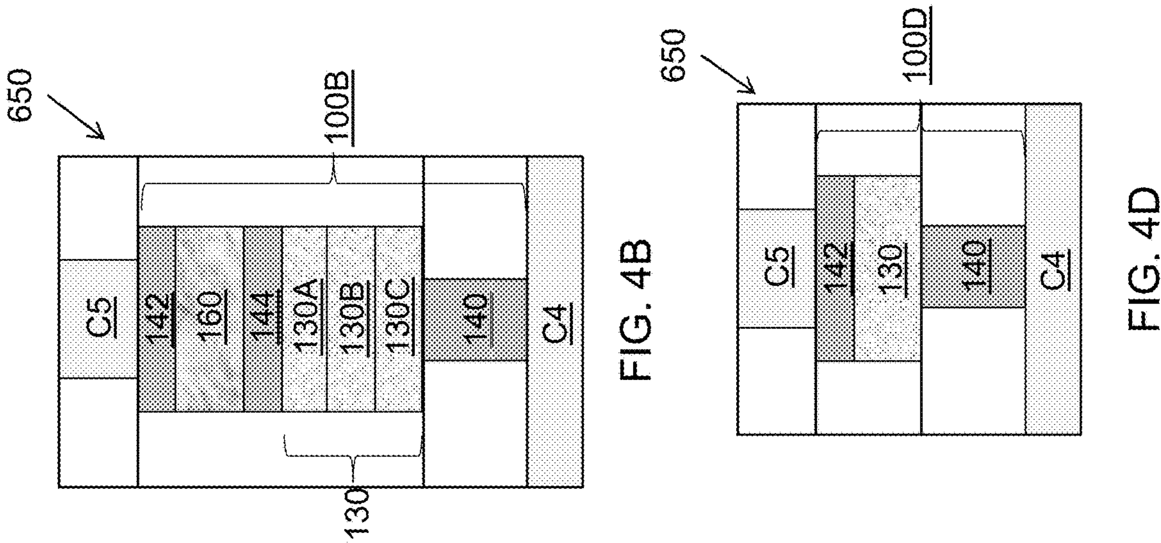
FIG. 4B
FIG. 4D
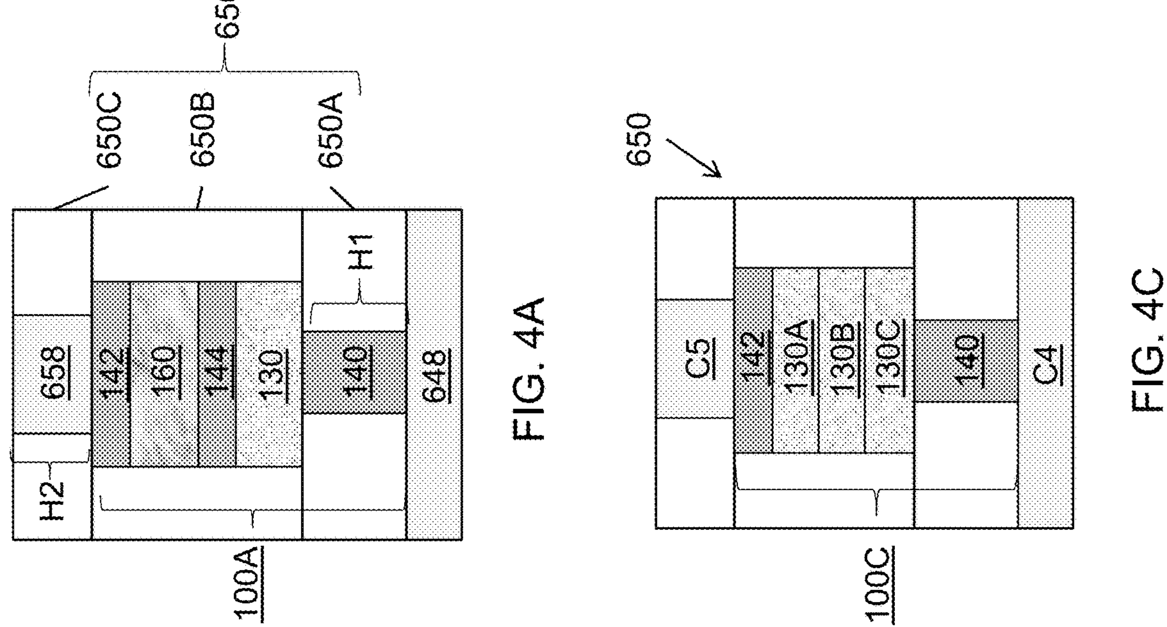
FIG. 4A
FIG. 4C

200°C Retention > 10000 sec
N doped Ge-rich GST612

Resistance (KΩ)
1E+3
1E+2
1E+1
1
10
100
1000
10000
Time (s)
200C

PHASE-CHANGE RANDOM ACCESS MEMORY DEVICE AND METHODS OF MAKING THE SAME

RELATED APPLICATION

The instant application is a continuation application of U.S. application Ser. No. 17/826,350, entitled "Phase-change Random Access Memory Device and Method of Making the Same", filed on May 27, 2022, which is a continuation application of U.S. application Ser. No. 16/785,023 entitled "Phase-change Random Access Memory Device with Doped GE-SB-TE Layers and Method of Making the Same", filed on Feb. 7, 2020 now patented as U.S. Pat. No. 11,349,070, the entire contents of both of which are incorporated herein by reference for all purposes.

BACKGROUND

The present disclosure is directed to semiconductor devices, and specifically to a phase-change random-access memory (PCM) structures having improved data retention and methods of forming the same.

A phase-change random-access memory (PCM or PCRAM) is a form of non-volatile random-access computer memory. PCRAM technology is based upon a material that can be either amorphous or crystalline at normal ambient temperatures. When the material is in the amorphous state, the material has a high electrical resistance. When the material is in the crystalline state, the material has a low electrical resistance. In order to control the state of the material, the material may be heated and cooled. By heating the material above its crystallization point, the material enters its crystalline state. The material may be heated, for example, by passing current through a heating element. As the material cools, it enters an amorphous state. PCRAMs also have the ability to achieve a number of distinct intermediary states, thereby having the ability to hold multiple bits in a single cell, but the difficulties in programming cells in this way has prevented these capabilities from being implemented in other technologies (most notably flash memory) the same capability. In addition, while existing PCRAMs have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D are vertical cross-sectional sectional views of phase-change memory cells that may be included in the memory device of FIG. 3, according to various embodiments of the present disclosure.

DETAILED DESCRIPTION

Figure 2:
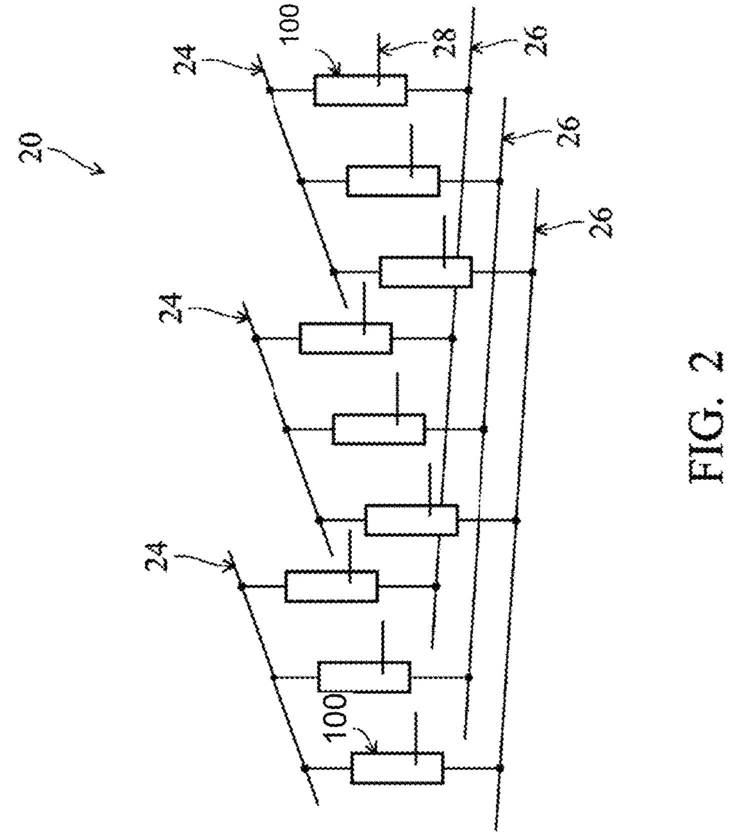
FIG. 2 is a schematic view of a PCRAM structure including multiple phase-change memory cells, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ranges can be expressed herein as from "about" one particular value, and/or to "about" another particular value. When such a range is expressed, examples include from the one particular value and/or to the other particular value. Similarly, when values are expressed as approximations, by use of the antecedent "about" or "substantially" it will be understood that the particular value forms another aspect. In some embodiments, a value of "about X" may include values of +/−1% X. It will be further understood that the endpoints of each of the ranges are significant both in relation to the other endpoint, and independently of the other endpoint.

A phase-change random-access memory (PCRAM) is a non-volatile memory device that makes use of different resistive phases and heat induced phase transition between the phases of phase-change materials including chalcogenide and resistive materials. A PCRAM may be composed of many memory cells that operate independently. A PCRAM cell may include a heater and a resistor. The PCRAM cell may operate as a data storage element made mainly of a reversible phase-change material to provide at least two dramatically different resistivities for logical "0"

state and "1" state. To read a state (data) from the PCRAM cell, a sufficiently small current is applied to the phase-change material without triggering the heater to generate heat. In this way, the resistivity of the phase-change material may be measured and the states representing the resistivities, i.e. a "0" state for high resistivity or a "1" state for low resistivity can be read.

To write a state (data) in the PCRAM cell, for example, to write a "1" state representing a low resistivity phase of the phase-change material, a medium electric current may be applied to the heater which generates heat for annealing the phase-change material at a temperature above the crystallization temperature but below the melting temperature of the phase-change material for a time period to achieve a crystalline phase. As the phase-change material heats to a temperature above the crystallization temperature, the material may enter a crystalline state where the phase-change material exhibits a low electrical resistance. With the low resistance value, a charge may flow into the material to establish the "1" state value.

To write a "0" state representing a high resistivity phase of the phase-change material, a very large electric current may be applied to the heater to generate heat to melt the phase-change material at a temperature higher than the melting temperature of the phase-change material; and the electric current is abruptly cut off to lower the temperature to below the crystallization temperature of the phase-change material to quench and stabilize the amorphous structure of phase-change material. As the phase change material enters the amorphous state, the phase-change material exhibits a high resistance value. The high resistance value may impede a charge from flowing into the material to establish a "0" state value. The very large electric current can thus be in a pulse form.

Figure 1:
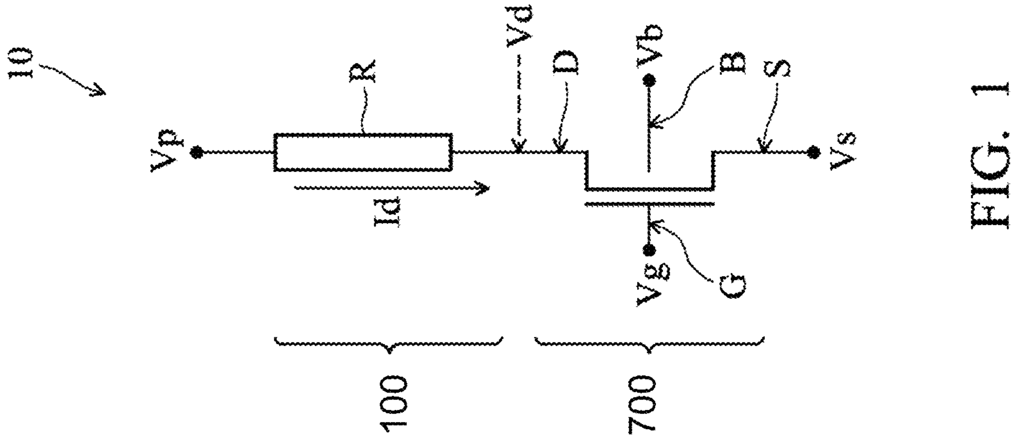
FIG. 1 is a schematic view of a phase-change random-access memory (PCRAM) structure including a phase-change memory cell a field effect transistor, according to various embodiments of the present disclosure.

FIG. 1 is a schematic view of a PCRAM structure 10 constructed according to an embodiment. The PCRAM structure 10 may include one phase-change memory cell 100 and a current-controlling device 700 connected together. The phase-change memory cell 100 includes a phase-change material layer interposed between two electrodes. In one embodiment, the resistance of the phase-change layer material is configured to be adjusted into multiple levels that represent different logic states, respectively.

The current-controlling device 700 in the PCRAM structure 10 may be a device that is operable to control the current flow through the phase-change memory cell 100 during the operations. In the present embodiment, the current-controlling device 700 is a transistor (or selector transistor), such as a field effect transistor (FET). For example, the FET 700 may be a metal-oxide-semiconductor (MOS) FET. The FET 700 includes source (S), drain (D) and gate (G). The source S and drain D may be designed asymmetrically, such that a voltage drop over the FET during a forming operation and an off-state leakage current may be collectively optimized. The source S and drain D may separately formed, so that the source S and drain D may be independently tuned to achieve the asymmetric structure. More particularly, the source S and drain D may be different from each other in term of doping concentration. In various embodiments, the source and drain may be different in at least one of doping concentration, doping profile and doping species.

The FET 700 may be electrically coupled with the memory cell 100. In the present example, one electrode of the memory cell 100 is connected to the drain D of the FET 700. The gate G of the FET 700 may be connected to a word line, and another electrode of the memory cell 100 may be connected to a bit line, as discussed in detail with regard to FIG. 3.

As illustrated in FIG. 1, the gate (G), source (S), drain (D) and body of the FET 700 are labeled as G, S, D, and B, respectively. The corresponding voltages of the gate, source, drain and substrate during the operations are labeled as Vg, Vs, Vd and Vb, respectively. Furthermore, during operation, the current through the memory cell 100 is labeled as Id, and the voltage applied to one electrode of memory cell 100 from the bit line is labeled as Vp.

In one embodiment, the PCRAM structure 10 may be a two terminal memory structure, with the gate of the FET 700 operating as a first terminal, and one electrode of the memory cell 100 operating as a second terminal. The first terminal is controlled by a first voltage applied to the gate G of FET 700 from the word line, and the second terminal is controlled by a second voltage applied to the one electrode of the phase-change memory cell from the bit line. In one example, the source is grounded, and the body of the FET 700 is grounded or floating.

In another embodiment, the PCRAM structure 10 may be a three terminal memory structure, wherein the three terminals include the gate of FET 700 as a first terminal, the electrode of the memory cell 100 (the electrode that is not directly connected with the drain of the transistor) as a second terminal, and the source of the FET 700 as a third terminal. Particularly, during the operations of the phase-change memory cell 100, the first terminal (gate) may be controlled by a first voltage from the word line, the second terminal may be controlled by a second voltage from the bit line, and the third terminal may be controlled by a third voltage from a source line. In one example, the source is grounded. In an alternative example, the second terminal is grounded. The substrate (or the body) of the FET 700 may be grounded or floating.

FIG. 2 is a schematic view of a memory structure 20 having a plurality of phase-change memory cells 100 constructed according various embodiments of the present disclosure. The phase-change memory cells 100 may be configured in an array coupled with a plurality of word lines 24 and a plurality of bit lines 26. In one embodiment, the word lines 24 and the bit lines 26 may be cross-configured. Furthermore, each of the phase-change memory cells 100 may be operable to achieve multiple resistance levels and accordingly multiple bit storage. In the present embodiment, source lines 28 are configured to connect to the sources of the memory cells 100, respectively. The source lines 28 may be configured such that one source line 28 is coupled with one respective phase-change memory cell 100. Alternatively, one source line may be coupled with a subset of the phase-change memory cells 100 in the memory structure 20.

Figure 3:
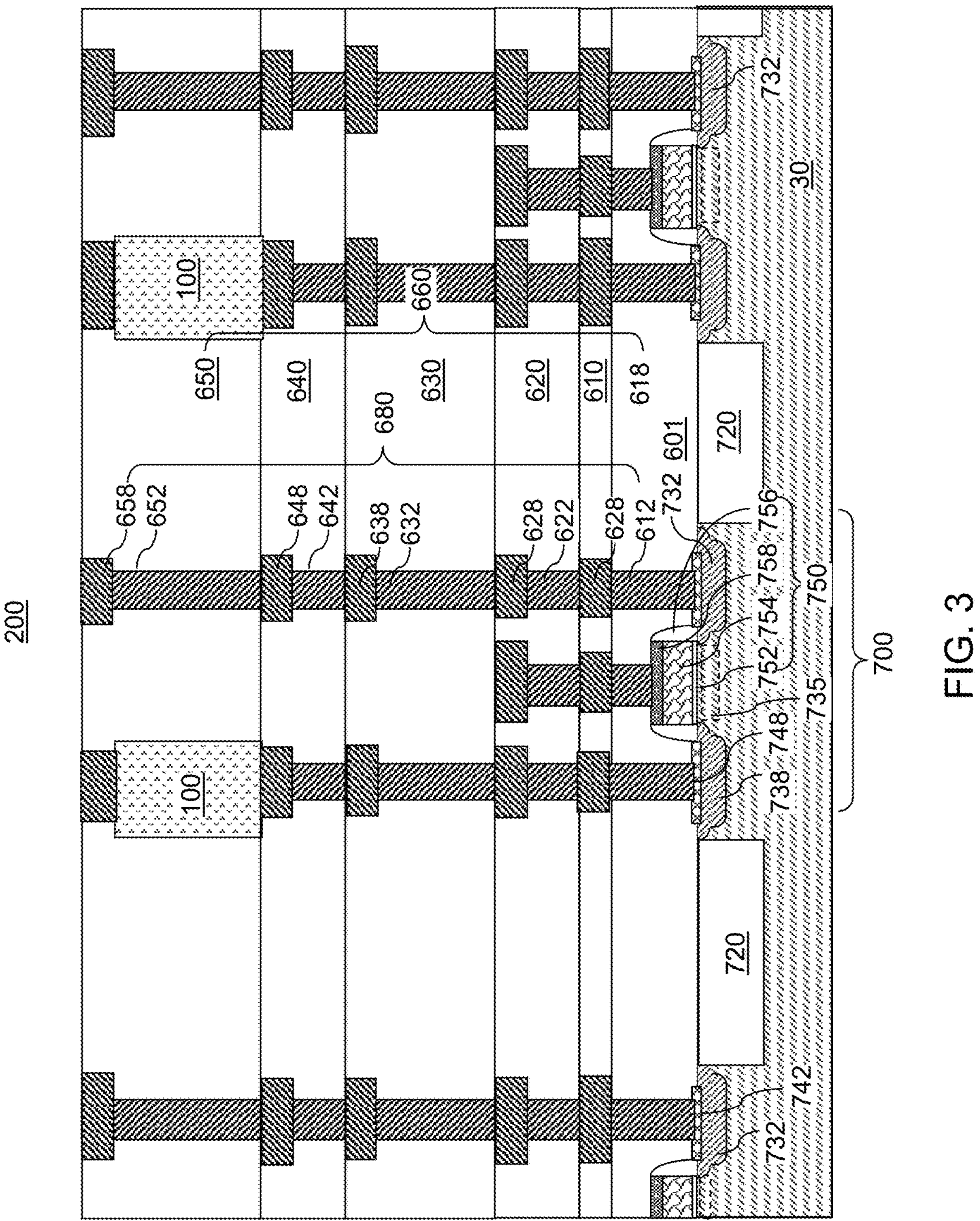
FIG. 3 is a vertical sectional view of a memory device including a phase-change memory cell and a FET, according to various embodiments of the present disclosure.

FIG. 3 is a cross sectional view of a memory device 200, according to various embodiments of the present disclosure. Referring to FIG. 3, the memory device 200 includes one or more phase-change memory cells 100 and corresponding field effect transistors (FETs) 700, disposed on a substrate 30. The memory device 200 can include a two-dimensional array of memory cells arranged in a 1T1R configuration, i.e., a configuration in which one access transistor is connected to one resistive memory cell.

The substrate 30 can be a semiconductor substrate such as a commercially available silicon substrate. Alternatively, or additionally, the substrate 30 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. Other suitable materials within the contemplated scope of disclosure may also be used.

The FETs 700 may provide functions that are needed to operate the memory cells 100. Specifically, the FETs 700 can be configured to control the programming operation, the erase operation, and the sensing (read) operation of the memory cells 100. In some embodiments, the memory device 200 may include sensing circuitry and/or a top electrode bias circuitry on the substrate 30. The FETs 700 may include complementary metal-oxide-semiconductor (CMOS) transistors. The substrate 30 may optionally include additional semiconductor devices (such as resistors, diodes, capacitors, etc.).

Shallow trench isolation structures 720 including a dielectric material such as silicon oxide can be formed in an upper portion of the substrate 30. Suitable doped semiconductor wells, such as p-type wells and n-type wells can be formed within each area that is laterally enclosed by a continuous portion of the shallow trench isolation structures 720. Accordingly, the FETs 700 may be formed on the substrate 30 between the isolation structures 720, such that the FETs 700 may be electrically isolated from one another by the isolation structures 720.

Each FET 700 may include a source region 732, a drain region 738, a semiconductor channel 735 that includes a surface portion of the substrate 30 extending between the source region 732 and the drain region 738, and a gate structure 750. Each gate structure 750 can include a gate dielectric 752, a gate electrode 754, a gate cap dielectric 758, and a dielectric gate spacer 756. A source-side metal-semiconductor alloy region 742 can be formed on each source region 732, and a drain-side metal-semiconductor alloy region 748 can be formed on each drain region 738.

In some embodiments, the channel region 735 may be doped with a first type dopant, and the source region 732 and the drain region 738 may be doped with a second type dopant, opposite to the first type. In the present example, the FET 700 may be an n-type FET (nFET). Accordingly, the channel region 735 may be p-type channel.

In one embodiment, the source region 732 may be formed by a first ion implantation process, and the drain region 738 may be formed by a second ion implantation process. The second ion implantation process may be different from the first ion implantation process in at least one of doping dose, implanting angle and dopant (doping species). In one embodiment, the first ion implantation process includes forming a first patterned mask on the substrate and applying the first ion implantation to the substrate using the first patterned mask as an implantation mask. The first patterned mask may include an opening such that a substrate region for the source is uncovered thereby. The first patterned mask may be a patterned photoresist layer formed by a lithography process, or alternatively, a patterned hard mask formed by lithography process and etching. Similarly, the second ion implantation process may include forming a second patterned mask on the substrate and applying the second ion implantation to the substrate using the second patterned mask as an implantation mask. The second patterned mask may include an opening such that a substrate region for the drain is uncovered thereby. The second patterned mask may be similar to the first patterned mask in terms of formation and composition.

Various metal interconnect structures 680 formed in dielectric material layers 660 may be formed over the substrate 30 and the devices formed thereon (such as the FETs 700). The dielectric material layers can include, for example, a contact-level dielectric material layer 601, a first metal-line-level dielectric material layer 610, a second line-and-via-level dielectric material layer 620, a third line-and-via-level dielectric material layer 630, a fourth line-and-via-level dielectric material layer 640, and a fifth line-and-via-level dielectric material layer 650.

The metal interconnect structures 680 may be formed by performing any suitable deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, an electroplating process, or a plasma enhanced CVD (PECVD) process.

The metal interconnect structures may include device contact via structures 612 formed in the contact-level dielectric material layer 601 and that contact respective component of the FETs 700, first metal lines 618 formed in the first metal-line-level dielectric material layer 610, first metal via structures 622 formed in a lower portion of the second line-and-via-level dielectric material layer 620, second metal lines 628 formed in an upper portion of the second line-and-via-level dielectric material layer 620, second metal via structures 632 formed in a lower portion of the third line-and-via-level dielectric material layer 630, third metal lines 638 formed in an upper portion of the third line-and-via-level dielectric material layer 630, third metal via structures 642 formed in a lower portion of the fourth line-and-via-level dielectric material layer 640, fourth metal lines 648 formed in an upper portion of the fourth line-and-via-level dielectric material layer 640, fourth metal via structures 652 formed in a lower portion of the fifth line-and-via-level dielectric material layer 650, and fifth metal lines 658 formed in an upper portion of the fifth line-and-via-level dielectric material layer 650. In one embodiment, the metal interconnect structures 680 can include source line that are connected a source-side power supply for an array of memory elements. The voltage provided by the source lines can be applied to the bottom electrodes through the access transistors provided in the memory array region 100.

Each of the dielectric material layers (601, 610, 620, 630, 640, 650) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648, 658) may include at least one conductive material, which can be a combination of a metallic liner layer (such as a metallic nitride or a metallic carbide) and a metallic fill material. Each metallic liner layer can include TIN, TaN, WN, TiC, TaC, and WC, and each metallic fill material portion can include W, Cu, Al, Co, Ru, Mo, Ta, Ti, alloys thereof, and/or combinations thereof. Other suitable materials within the contemplated scope of disclosure may also be used. In one embodiment, the first metal via structures 612 and the first metal line 618 may be formed as integrated line and via structures by a dual damascene process, the second metal via structure 622 and the second metal lines 628 may be formed as integrated line and via structures by a dual damascene process, the third metal via structures 632 and the third metal lines 638 may be formed as integrated line and via structures by a dual damascene process, the fourth metal via structures 642 and the fourth metal lines 648 may be formed as integrated line and via structures by a dual damascene process, and/or the fifth metal via structures 652 and the fourth metal lines 648 may be formed as integrated line and via structures by a dual damascene process.

In some embodiments, the memory cells 100 may be disposed within the fifth dielectric material layer 650, and each memory cell 100 may be electrically connected to a respective fourth metal line 648 and a fifth metal line 658. However, the present disclosure is not limited to any particular location for the memory cells 100. For example, the memory cells 100 may be disposed within any of the dielectric material layers 660.

The metal interconnect structures 680 may be configured to connect each memory cell 100 to a corresponding FET 700, and to connect the FET 700 to corresponding signal lines. For example, the drain region 738 of the FET 700 may be electrically connected to a bottom electrode (see FIGS. 4A-4D) of the memory cell 100 via, for example, a subset of the metallic via structures (612, 622, 632, 642) and a subset of the metal lines (618, 628, 638, 648). Each drain region 738 may be connected to a first node (such as a bottom node) of a respective memory cell 100 via a respective subset of the metal interconnect structures 680. The gate electrode 754 of each FET 700 may be electrically connected to a word line, which can be embodied as a subset of the metal interconnect structures 680. A top electrode (see FIGS. 4A-4D) of each memory cell 100 may be electrically connected to a respective bit line, which is embodied as a respective subset of the metal interconnect structures. Each source region 732 may be electrically connected to a respective source line, which is embodied as a respective subset of the metal interconnect structures. While only five levels of metal lines are illustrated in FIG. 3, it is understood that more metal line levels can be formed above the illustrated levels of FIG. 3. Further, it is understood that the levels in which the source lines, word lines, and bit lines are formed may be selected based on design parameters.

FIG. 4A is cross-sectional sectional view of a phase-change memory cell 100A that may be included in the PCRAM device 200 of FIG. 3, according to various embodiments of the present disclosure. Referring to FIGS. 3 and 4A, the memory cell 100A may be disposed between two overlapping conductive lines, such as conductive lines 648 and 658. With respect to the memory cell 100A, the conductive lines 648, 658 may be respectively referred to herein as a bottom conductive line 648 and a top conductive line 658.

The memory cell 100A may include a bottom electrode 140 disposed on the bottom conductive line 648, a phase-change layer 130 disposed on the bottom electrode 140, a barrier electrode 144 disposed on the phase-change layer 130, a selector layer 160 disposed on barrier electrode 144, and a top electrode 142 disposed on the selector layer 160. The bottom electrode 140 may be electrically connected to the conductive line 648, and the top electrode may be electrically connected to the overlapping conductive line 658.

In some embodiments, the dielectric layer 650 may include a bottom dielectric layer 650A, a middle dielectric layer 650B, and a top dielectric layer 650C. The dielectric layers 650A-650C may have a thickness in a range from about 5 to about 350 nm, for example, although greater or lesser thicknesses may be within the contemplated scope of disclosure.

In various embodiments, the bottom dielectric layer 650A contacts side surfaces of the bottom electrode 140 and top surface of the bottom conductive line 648. In particular, the bottom electrode 140 may be disposed in a via or through-hole H1 formed in the bottom dielectric layer 650A and may electrically connect the conductive line 648 and the phase-change layer 130. The phase-change layer 130, barrier electrode 144, selector layer 160, and the top electrode 142 may be disposed within the middle dielectric layer 650B. For example, the middle dielectric layer 650B may be deposited after forming the top electrode 142. The top dielectric layer 650C may include a through-hole H2 in which the top conductive line 658 is disposed. While the dielectric layers 650A, 650B, 650C are shown in FIG. 4A as being distinct layers, the dielectric layers 650A, 650B, 650C may be substantially indistinguishable from one another.

The electrodes 140, 142, 144 may be formed of a conductive barrier material such as TiN, TaN, or TiAlN. Other suitable materials are within the contemplated scope of disclosure. The electrodes 140, 142, 144 may be configured to reduce and/or prevent the diffusion metal species from the bottom and/or top conductive lines 648, 658 into the phase-change layer 130 and/or the selector layer 160. The electrodes 140, 142, 144 may have a thickness in a range from about 5 to about 50 nm. Although greater or lesser thicknesses may be within the contemplated scope of disclosure. One or more of the electrodes 140, 142, 144 may be configured to provide Joule heating to the phase-change layer 130. For example, at least the bottom electrodes 140 may be configured to heat the phase-change layer 130. The electrodes 140, 142, 144 may also function as a heat sink during quenching (during abrupt cutoff of the current applied to the electrodes 140, 142, 144 to "freeze" the phase-change layer 130 in an amorphous phase). The dielectric layer 650 may also be configured to prevent and/or reduce heat transfer between adjacent memory cells 100, so as to avoid thermal disturbance which may disable state retention or interrupt the read/write process.

In some embodiments, the selector layer 160 provides a current-voltage non-linearity to the PCRAM structure, and this reduces leakage current. The selector layer 160 may have a single-layer or multi-layered structure, in some embodiments. The selector layer 160 may have a thickness ranging from about 0.5 nm to about 50 nm. Although greater or lesser thicknesses may be within the contemplated scope of disclosure. In some embodiments, the selector layer 160 is formed by chemical vapor deposition (CVD), pulsed laser deposition (PLD), sputtering, atomic layer deposition (ALD), or any other thin film deposition method.

In some embodiments, the selector layer 160 comprises SiOx, TiOx, AlOx, WOx, TixNOz, HfOx, TaOx, NbOx, or the like, or suitable combinations thereof, where x, y and z are non-stoichiometric values. Other suitable materials are within the contemplated scope of disclosure. In some embodiments, the selector layer 160 may be a solid-electrolyte material containing one or more of Ge, Sb, S, Te, or a chalcogenide such as N, P, S, Si, and/or a Te doped chalcogenide such as N, P, S, Si, and/or Te doped AsGeSe, e.g., AsGeSe(N, P, S, Si, Te), and N, P, S, Si, and/or Te doped AsGeSeSi, e.g., AsGeSeSi(N, P, S, Si, Te). Other suitable materials are within the contemplated scope of disclosure.

The phase-change layer 130 may be formed by performing an electroplating process, a chemical vapor deposition (CVD) process, a physical vapor deposition, (PVD) process, or an atomic layer deposition (ALD) process. For example, the phase-change layer 130 may be formed by PVD at a temperature ranging from about 175° C. to about 225° C., such as about 200° C. A deposition device may be operated at a Wattage ranging from about 25 to about 200 W, during the deposition process.

Conventionally, memory cells include phase-change layers formed of chalcogenide Ge—Sb—Te (GST) phase-change materials that have relatively low Germanium (Ge) contents. For example, $Ge_2Sb_2Te_5$ (GST-225) is commonly used as a phase-change material. However, materials such as GST-225 have a crystallization temperature (Tc) of between 100° C. and 650° C. As a result, conventional phase change memory cells suffer from loss of data retention in devices having operating temperatures of above about 100° C. to 650° C., due to unintentional melting of the GTS-225.

In various embodiments, the phase-change layer 130 may comprise a chalcogenide GST material that has a higher Tc than conventional phase-change layers. For example, the phase-change layer 130 may have a Tc ranging from about 175° C. to about 350° C., such as from about 200° C. to about 300° C., or at least about 250° C. As such, the phase-change layer 130 may be configured to provide improved data retention at common operating temperatures.

For example, according to various embodiments the phase-change layer 130 comprises a Ge-rich GST material that may be doped with N, Si, Sc, Ga, C, or any combination thereof. In particular, the phase-change layer 130 may comprise a doped GST material that includes: from about 30 atomic percent (at %) to about 80 at % Ge, such as from about 40 at % to about 60 at % Ge; from about 10 at % to about 30 at % Sb, such as from about 15 at % to about 25 at % Sb; from about 10 at % to about 40 at % Te, such as from about 15 at % to about 35 at % Te; and from about 1 at % to about 10 at % dopant, such as from about 2 at % to about 8 at % dopant. In some embodiments, the phase-change layer 130 may comprise a $Ge_6Sb_1Te_2$ (GST-612) material doped with from about 1 at % to about 10 at % of the dopant.

By providing a phase-change layer 130 with a Ge-rich GST material having a Ge content of at least about 30 at %, the phase-change layer 130 may exhibit improved data retention characteristics. In addition, by providing the phase-change layer 130 with a dopant content of about 10 at % or less also provides for improved data retention, without degrading film quality during deposition. Accordingly, in some embodiments the phase-change layer 130 may comprise a GST-612 material doped with less than about 10 at % of N, Si, Sc, Ga, C, or any combination thereof.

In some embodiments, the composition of the phase-change layer 130 may remain substantially constant. However, in other embodiments, the Ge content of the phase-change layer 130 may vary according to a gradient. For example, the Ge content may vary by about +/−10 at % to about +/−30 at %, in a widthwise direction (e.g., in a direction between the electrodes 140 and 142). For example, the Ge content of the phase-change layer 130 may decrease as distance from the bottom electrode 140 increases, such that the Ge content of an upper portion of the phase-change layer 130A is from about 15 at % to about 25 at %, such as about 20 at %, less than the Ge content of a lower portion of the phase-change layer 130C.

FIG. 4B is cross-sectional sectional view of a phase-change memory cell 100B that may be included in the PCRAM device 200 of FIG. 3, according to various embodiments of the present disclosure. The memory cell 100B is similar to the memory cell 100A, so only the differences therebetween will be discussed in detail.

Referring to FIG. 4B, the memory cell 100B may include a phase-change layer 130 that includes at least two sublayers comprising different doped, Ge-rich, GST materials. For example, the phase-change layer 130 may include three sublayers, namely an upper sublayer 130A, a middle sublayer 130B, and a lower sublayer 130C, as shown in FIG. 4B. However, other embodiments in which additional number of layers in the phase change layer each with a respective Ge content that may decrease as distance from the bottom electrode 140 increases are within the contemplated scope of disclosure.

The sublayers 130A, 130B, 130C may include doped, Ge-rich GST materials that have a gradient of different Ge contents. For example, the Ge content of the upper sublayer 130A may differ from the Ge content of the lower sublayer 130C by from about +/−30 at % to about +/−10 at %, such as from about +/−25 at % about +/−15 at %, or about +/−20 at %. The Ge content of the sublayer 130B may differ from the Ge content of the upper and/or lower sublayers 130A, 130C, by from about +/−15 at % to about +/−5 at %, such as about +/−10 at %.

For example, in some embodiments, the upper sublayer 130A may comprise from about 35 at % to about 45 at % Ge, such as about 40 at % Ge; from about 25 at % to about 15 at % Sb, such as about 20 at % Sb; from about 35 at % to about 45 at % Te, such as about 40 at % Te; and from about 1 at % to about 10 at % dopant. The middle sublayer 130B may comprise from about 45 at % to about 55 at % Ge, such as about 50 at % Ge; from about 12 at % to about 23 at % Sb, such as about 18 at % Sb; from about 27 at % to about 37 at % Te, such as about 32 at % Te; and from about 1 at % to about 10 at % of dopant. The lower sublayer 130C may comprise from about 50 at % to about 70 at % Ge, such as about 60 at % Ge; from about 11 at % to about 21 at % Sb, such as about 16 at % Sb; from about 19 at % to about 29 at % Te, such as about 24 at % Te; and from about 1 at % to about 10 at % dopant.

FIG. 4C is cross-sectional sectional view of a phase-change memory cell 100C that may be included in the PCRAM device 200 of FIG. 3, according to various embodiments of the present disclosure. The memory cell 100C is similar to the memory cell 100B, so only the differences therebetween will be discussed in detail.

Referring to FIG. 4C, the memory cell 100C omits the barrier electrode 144 and the selector layer 160 of the memory cell 100B. Accordingly, the top electrode 142 directly contacts the upper sublayer 130A and the conductive line 658. AS with the embodiment memory cell 100B illustrated in FIG. 4B, the Ge-rich GST materials in each of sub layers 103A-130C may have a gradient of different Ge contents such that a respective Ge content that may decrease as distance from the bottom electrode 140 increases are within the contemplated scope of disclosure.

FIG. 4D is cross-sectional sectional view of a phase-change memory cell 100D that may be included in the PCRAM device 200 of FIG. 3, according to various embodiments of the present disclosure. The memory cell 100D is similar to the memory cell 100A, so only the differences therebetween will be discussed in detail.

Referring to FIG. 4D, the memory cell 100D omits the barrier electrode 144 and the selector layer 160 of the memory cell 100A. Accordingly, the top electrode 142 directly contacts the phase-change layer 130 and the conductive line 658. The concentration of Ge may be constant throughout phase change layer 130.

Figures 5A, 5B:
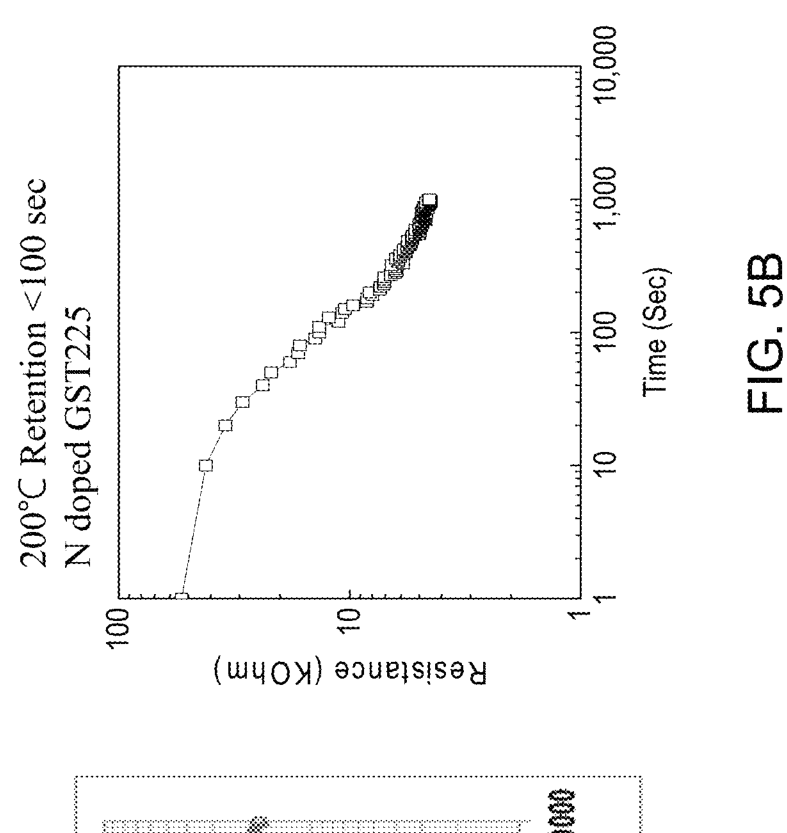
FIG. 5A is a graph showing resistance over time of an exemplary phase-change memory cell comprising a phase change layer comprising GST-612 doped with nitrogen, when heated to 200° C., according to various embodiments of the present disclosure.
FIG. 5B is a graph showing resistance over time of a comparative phase-change memory cell comprising a conventional phase change layer comprising $Ge_2Sb_2Te_5$ (GST-225) doped with nitrogen, when heated to 200° C.

FIG. 5A is a graph showing resistance over time of an exemplary phase-change memory cell comprising a phase change layer comprising GST-612 doped with nitrogen, when heated to 200° C., according to various embodiments of the present disclosure. FIG. 5B is a graph showing resistance over time of a comparative phase-change memory cell comprising a conventional phase change layer comprising $Ge_2Sb_2Te_5$ (GST-225) doped with nitrogen, when heated to 200° C.

Referring to FIGS. 5A and 5B, it can be seen that the exemplary memory cell with enhanced Ge concentrations in accordance with the various embodiment memory cell 100A-100D illustrated in FIGS. 4A-4D and described above maintained a resistance level indicative of stable memory storage for more than 10,000 seconds, when heated at a temperature of 200° C. Accordingly, FIG. 5A demonstrates that the doped GST-612 phase change layer of the various embodiment memory cells 100A-100D had a Tc of above 200° C., and thus, the various embodiment memory cells 100A-100D may be capable of stable memory storage at a temperature of at least 200° C.

In contrast, the resistance of the comparative memory cell having a phase change layer comprising N doped GST-225 material decreased substantially after about 100 seconds, when heated at 200° C. Accordingly, FIG. 5B demonstrates that the doped GST-225 phase change layer of the comparative memory cell had a Tc of less than 200° C., and thus, the comparative memory cell was not capable of stable memory storage at a temperature of at least 200° C.

Figure 6:
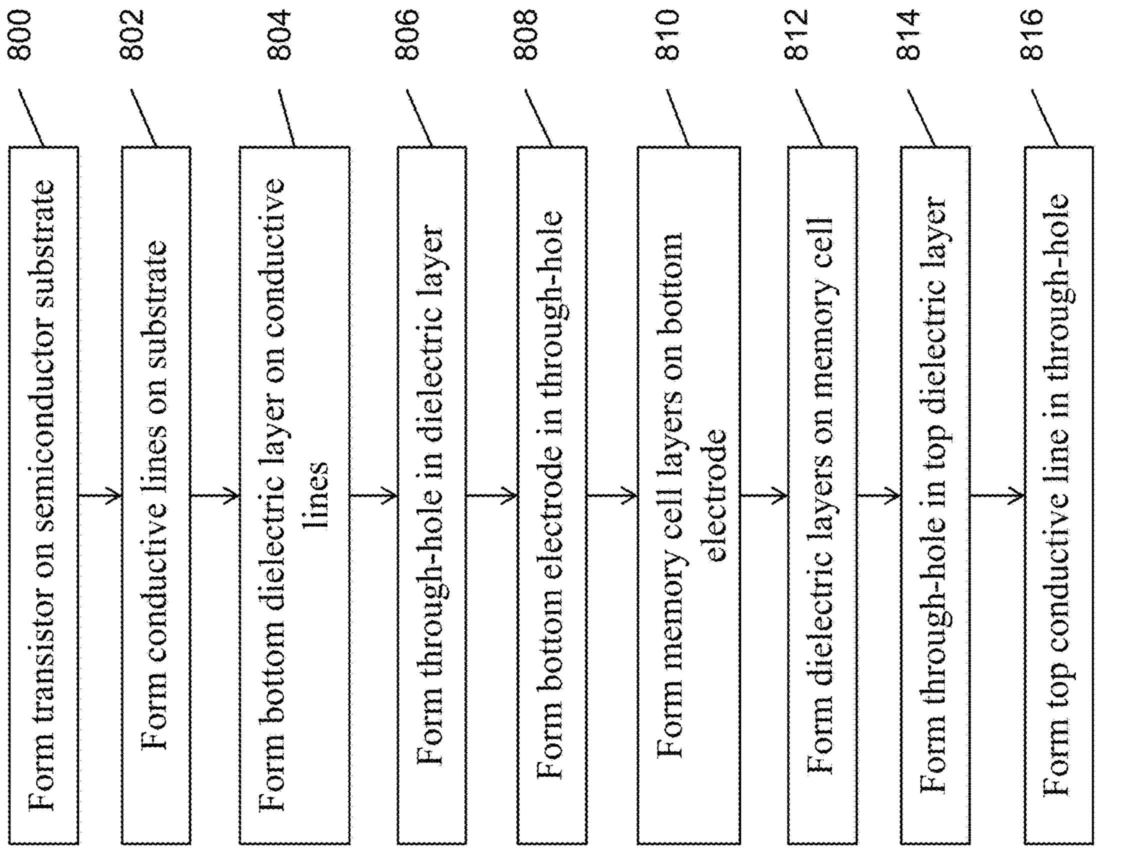
FIG. 6 is a flow chart showing a method of forming a memory device including a phase-change memory cell, according to various embodiments of the present disclosure.

FIG. 6 is a flow chart showing a method of forming a memory device including a phase-change memory cell, according to various embodiments of the present disclosure. While the method is described with respect to forming a single memory cell, the method may include forming multiple memory cells, in various embodiments.

Referring to FIG. 6, in step 800 the method may include forming at least one transistor on a semiconductor substrate. For example, a FET 700 may be formed on the substrate 30. Additional FET's 700 may also be formed on the substrate 30 for each memory cell 100 to be included in the memory device 200.

In step 802, conductive lines 600 may be formed on the substrate 300. In particular, one or more layers of parallel conductive lines 600 may be formed on the substrate 30, with each layer of conductive lines 600 being separated by a dielectric layer (i.e., 601, 610, 620, 630, 640, 650), with the conductive lines 600 of adjacent layers crossing one another in a mesh or grid pattern. The conductive lines and dielectric layers (i.e., 601, 610, 620, 630, 640, 650) may be formed by any suitable deposition processes, which may include patterned etching and/or planarization processes. The conductive lines may include a bottom conductive line of the memory cell.

In step 804, a bottom dielectric layer 650 may be formed on the conductive lines 648. In step 806, a through-hole may be formed in the bottom dielectric layer 650 using a patterned etching process. The through-hole may expose the bottom conductive line 648 of the memory cell.

In step 808, a bottom electrode 140 of the memory cell 100 may be formed in the through-hole using a deposition process and a planarization process.

In step 810, layers (e.g., 130, 144, 160, 142) of the memory cell 100 may be formed on the bottom electrode 140. For example, at least a phase-change layer 130 and a top electrode 142 may be formed on the bottom electrode 140. The phase-change layer 130 may be formed by depositing a doped, Ge-rich GST material over the bottom electrode 140. In some embodiments, the phase-change layer 130 may be formed by depositing multiple sub-layers (e.g., 130A-130C) of doped, Ge-rich GST materials on the substrate 30, with the sublayers 130A-130C having graded Ge contents.

In some embodiments, step 810 may include forming a barrier electrode 144 on the phase-change layer 130, forming a selector layer 160 on the barrier electrode 144, and then forming the top electrode 142 on the selector layer 160. The layers 144, 160, 142 formed in step 810 may be formed by using deposition and planarization processes to deposit and planarize each layer.

In step 812, one or more dielectric layers 650A-650C may be formed on the substrate. For example, a middle dielectric layer 650B may be formed that surrounds the layers 144, 160, 142 formed in step 810. The middle dielectric layer 650B may be planarized after deposition. A top dielectric layer 650C may be formed on the middle dielectric layer 650B and the top electrode 142.

In step 814, a through-hole may be formed in the top dielectric layer 650C. For example, the through-hole may be formed by a patterned etching process. In step 816, a top conductive line 658 may be formed in the through-hole using a deposition process and a planarization process.

In various embodiments, steps 806-816 may be used to form multiple memory cells 100A-100D. For example, steps 806 and 814 may include forming multiple through-holes, step 808 may include forming bottom electrodes 140 of multiple memory cells, step 810 may include forming memory cell layers 130A-130C of multiple memory cells, and step 816 may include forming multiple top conductive lines.

The various embodiments disclosed herein provide structures and methods to form a PCRAM device with improved memory characteristics. By enriching a phase-change layer 130 with germanium (Ge) the resistance retention characteristic of the phase change layer 130 may be improved to remain essentially constant for over 10000 seconds. In contrast, conventional phase-change layers comprising N-doped GST225 have been shown to dramatically lose their resistance values after 10 seconds. Additional embodiments provide enhanced resistance retention characteristics by providing multiple sub-layers of the phase change layer 130, wherein the respective concentration of Ge decreases as the respective sub-layer increases its distance from a bottom electrode 140.

According to an aspect of the present disclosure, a memory device structure is provided that includes a substrate 30. A bottom electrode 140 may be disposed over the substrate 30. A top electrode 142 may be disposed over the bottom electrode 140. The memory device structure may include a phase-change layer 130 disposed between the top and bottom electrodes 142, 140, the phase change layer 130 may comprise a chalcogenide Ge—Sb—Te (GST) material that comprises at least 30 at % Ge and that is doped with a dopant comprising N, Si, Sc, Ga, C, or any combination thereof.

In one embodiment, the phase-change layer may be made up of multiple sublayers. A first sublayer 130C may be disposed between the top and bottom electrodes and comprising the GST material. A second sublayer 130A may be disposed between the top and bottom electrodes and comprising a GST material that comprises at least 30 at % Ge and that is doped with a dopant comprising N, Si, Sc, Ga, C, or any combination thereof, wherein a Ge content of the first and second electrodes differs by from about 10 at % to about 30 at %. In another embodiment, a third sublayer 130B may be disposed between the first and second sublayers and comprising a GST material that comprises at least 30 at %

Ge and that is doped with a dopant comprising N, Si, Sc, Ga, C, or any combination thereof, wherein a Ge content of the third sublayer is greater than the Ge content of the first sublayer and is less than the Ge content of the second sublayer.

According to another aspect of the present disclosure a method of forming a phase-change memory device is provided. The method includes the operations of forming a transistor 700 on a substrate 30. The method further includes the operation of forming a bottom conductive line 648 on the substrate 30. The method further includes the operation of forming a bottom electrode 140 on the bottom conductive line 648 and forming a phase-change layer 130 on the bottom electrode 140. The method further including the operation of forming a top electrode 142 on the phase change layer 130, wherein the phase-change layer 130 comprises a chalcogenide Ge—Sb—Te (GST) material that comprises at least 30 at % Ge and that is doped with a dopant comprising N, Si, Sc, Ga, C, or any combination thereof.

According to another aspect of the present disclosure, a memory device is provided that may include: a bottom electrode 140; a top electrode 142 disposed over the bottom electrode 140; and a phase-change layer 130 disposed between the top electrode 142 and bottom electrode 140, the phase change layer 130 comprising: an upper sublayer 130A comprising a chalcogenide germanium (Ge)-antimony (At)-tellurium (Te) (GST) material that comprises at least 30 at % Ge; a lower sublayer 130C comprising a GST material; and a middle sublayer 130B disposed between the upper sublayer 130A and the lower sublayer 130C and comprising a GST material, wherein the lower sublayer 130C directly contacts the bottom electrode 140, a Ge content of the lower sublayer 130C is from about 10 at % to about 30 at % greater than a Ge content of the upper sublayer 130A, and a Ge content of the middle sublayer 130B is greater than the Ge content of the upper sublayer 130A and is less than the Ge content of the lower sublayer 130C.

In one embodiment, the phase-change layer 130 has a crystallization temperature of at least 200° C. In one embodiment, a first conductive line 648 electrically connected to the bottom electrode 140; and a second conductive line 658 electrically connected to the top electrode 142, wherein the first conductive line 648 and the second conductive line 658 are different ones of a word line and a bit line. In one embodiment, the top electrode 142 and bottom electrode 140 comprise titanium nitride (TiN); and the first conductive line 648 and the second conductive line 658 comprise Cu. In one embodiment, the memory device may also include: a barrier electrode 144 disposed on the phase-change layer 130; and a selector layer 160 disposed between the barrier electrode 144 and the top electrode 142. In one embodiment, the memory device may also include: a field effect transistor 700 that is electrically connected to the bottom electrode 140; and a dielectric layer 650 comprising a through-hole, wherein the bottom electrode 140 is disposed in the through-hole. In one embodiment, the memory device may also include: a dielectric material that surrounds the top electrode 142, the bottom electrode 140, and the phase-change layer 130, wherein the top electrode 142 directly contacts the phase-change layer 130. In one embodiment, the upper sublayer 130A, the lower sublayer 130C and the middle sublayer 130B are doped with a dopant comprising nitrogen (N), silicon (Si), scandium (Sc), gallium (Ga), carbon (C), or any combination thereof. In one embodiment, the upper sublayer 130A comprises: from about 35 at % to about 45 at % Ge; from about 15 at % to about 25 at % Sb; and from about 35 at % to about 45 at % Te; the middle sublayer 130B comprises: from about 45 at % to about 55 at % Ge; from about 13 at % to about 23 at % Sb; and from about 27 at % to about 37 at % Te; and the lower sublayer 130C comprises: from about 55 at % to about 65 at % Ge; from about 11 at % to about 21 at % Sb; and from about 19 at % to about 29 at % Te. In one embodiment, the lower sublayer 130C directly contacts the bottom electrode 140.

According to another aspect of the present disclosure, a memory device is provided that may include: a bottom electrode 140; a top electrode 142 disposed over the bottom electrode 140; and a phase-change layer 130 disposed between the top electrode 142 and bottom electrode 140, the phase change layer 130 comprising: an upper sublayer 130A comprising a chalcogenide germanium (Ge)-antimony (At)-tellurium (Te) (GST) material that comprises at least 30 at % Ge; and a lower sublayer 130C comprising a GST material, wherein the lower sublayer 130C directly contacts the bottom electrode 140, and a Ge content of the lower sublayer 130C is from about 10 at % to about 30 at % greater than a Ge content of the upper sublayer 130A.

In one embodiment, the upper sublayer 130A comprises: from about 35 at % to about 45 at % Ge; from about 15 at % to about 25 at % Sb; and from about 35 at % to about 45 at % Te; and the lower sublayer 130C comprises: from about 55 at % to about 65 at % Ge; from about 11 at % to about 21 at % Sb; and from about 19 at % to about 29 at % Te. In one embodiment, the memory device may also include: a barrier electrode 144 disposed on the phase-change layer 130; and a selector layer 160 disposed between the barrier electrode 144 and the top electrode 142. In one embodiment, the memory device may also include: a dielectric material 650 that surrounds the top electrode 142, the bottom electrode 140, and the phase-change layer 130, wherein the top electrode 142 directly contacts the phase-change layer 130. In one embodiment, the upper sublayer 130A and the lower sublayer 130C are doped with a dopant comprising nitrogen (N), silicon (Si), scandium (Sc), gallium (Ga), carbon (C), or any combination thereof. In one embodiment, the memory device may also include: a first conductive line 648 electrically connected to the bottom electrode 140; and a second conductive line 658 electrically connected to the top electrode 142, wherein the first conductive line 648 and the second conductive line 658 are different ones of a word line and a bit line. In one embodiment, the phase-change layer 130 has a crystallization temperature of at least 200° C.; the top electrode 142 and the bottom electrode 140 comprise titanium nitride (TiN); and the first conductive line 648 and the second conductive line 658 comprise Cu. In one embodiment, the memory device may also include: a field effect transistor 700 that is electrically connected to the bottom electrode 140; and a dielectric layer 650 comprising a through-hole, wherein the bottom electrode 140 is disposed in the through-hole.

According to another aspect of the present disclosure, a memory device is provided that may include: a bottom electrode 140; a top electrode 142 disposed over the bottom electrode 140; and a phase-change layer 130 disposed between the top electrode 142 and bottom electrode 140, the phase change layer 130 comprising: an upper sublayer 130A comprising a chalcogenide germanium (Ge)-antimony (At)-tellurium (Te) (GST) material that comprises from about 35 at % to about 45 at % Ge; and a lower sublayer 130C comprising a GST material that comprises from about 55 at % to about 65 at % Ge, wherein the lower sublayer 130C directly contacts the bottom electrode 140.

In one embodiment, the upper sublayer 130A and the lower sublayer 130C are doped with a dopant comprising nitrogen (N), silicon (Si), scandium (Sc), gallium (Ga), carbon (C), or any combination thereof; the phase-change layer 130 has a crystallization temperature of at least 200° C.; the upper sublayer 130A comprises: from about 15 at % to about 25 at % Sb; and from about 35 at % to about 45 at % Te; and the lower sublayer 130C comprises: from about 11 at % to about 21 at % Sb; and from about 19 at % to about 29 at % Te.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
- a bottom electrode;
- a top electrode disposed over the bottom electrode; and
- a phase-change layer disposed between the top electrode and bottom electrode and comprising a chalcogenide germanium (Ge)-antimony (At)-tellurium (Te) (GST) material, wherein:
  - a Ge content of the phase change layer varies by from about 10 at % to about 30 at %, in a thickness direction extending from the top electrode to the bottom electrode; and
  - the phase change layer has a minimum Ge content of at least 30 at %.

2. The memory device of claim 1, wherein the phase-change layer has a crystallization temperature of at least 200° C.

3. The memory device of claim 1, further comprising:
- a first conductive line electrically connected to the bottom electrode; and
- a second conductive line electrically connected to the top electrode,
- wherein the first conductive line and the second conductive line are different ones of a word line and a bit line.

4. The memory device of claim 3, wherein:
- the top electrode and the bottom electrode comprise titanium nitride (TiN); and
- the first conductive line and the second conductive line comprise Cu.

5. The memory device of claim 1, further comprising:
- a barrier electrode disposed on the phase-change layer; and
- a selector layer disposed between the barrier electrode and the top electrode.

6. The memory device of claim 1, further comprising:
- a field effect transistor that is electrically connected to the bottom electrode; and
- a dielectric layer comprising a through-hole,
- wherein the bottom electrode is disposed in the through-hole.

7. The memory device of claim 1, further comprising a dielectric material that surrounds the top electrode, the bottom electrode, and the phase-change layer,
- wherein the top electrode directly contacts the phase-change layer.

8. The memory device of claim 1, wherein the phase-change layer comprises:
- an upper sublayer comprising a GST material;
- a lower sublayer comprising a GST material; and
- a middle sublayer comprising a GST material and disposed between the upper sublayer and the lower sublayer.

9. The memory device of claim 8, wherein:
- the upper sublayer comprises:
  - from about 35 at % to about 45 at % Ge;
  - from about 15 at % to about 25 at % Sb; and
  - from about 35 at % to about 45 at % Te;
- the middle sublayer comprises:
  - from about 45 at % to about 55 at % Ge;
  - from about 13 at % to about 23 at % Sb; and
  - from about 27 at % to about 37 at % Te; and
- the lower sublayer comprises:
  - from about 55 at % to about 65 at % Ge;
  - from about 11 at % to about 21 at % Sb; and
  - from about 19 at % to about 29 at % Te.

10. The memory device of claim 8, wherein the upper sublayer, the lower sublayer and the middle sublayer are doped with a dopant comprising nitrogen (N), silicon (Si), scandium (Sc), gallium (Ga), carbon (C), or any combination thereof.

11. A memory array comprising:
- transistors disposed on a substrate;
- word lines electrically connected to gate electrodes of the transistors;
- source lines electrically connected to source regions of the transistors;
- memory cells disposed over the transistors;
- contact features CO electrically connecting drain regions 36 of the transistors to bottom electrodes of the memory cells; and
- bit lines electrically connected to top electrode of the memory cells,
- wherein:
  - the memory cells each comprise a phase-change layer disposed between the top electrode and bottom electrode and comprising a chalcogenide germanium (Ge)-antimony (Sb)-tellurium (Te) (GST) material;
  - a Ge content of the phase change layer varies by from about 10 at % to about 30 at %, in a thickness direction extending from the top electrode to the bottom electrode; and
  - the phase change layer has a minimum Ge content of at least 30 at %.

12. The memory array of claim 11, wherein the phase-change layers comprise:
- an upper sublayer comprising a GST material that comprises at least 30 at % Ge; and
- a lower sublayer comprising a GST material, wherein the lower sublayer directly contacts the bottom electrode, and a Ge content of the lower sublayer is from about 10 at % to about 30 at % greater than a Ge content of the upper sublayer.

13. The memory array of claim 12, wherein:
- the upper sublayer comprises:
  - from about 35 at % to about 45 at % Ge;
  - from about 15 at % to about 25 at % Sb; and
  - from about 35 at % to about 45 at % Te; and
- the lower sublayer comprises:
  - from about 55 at % to about 65 at % Ge;
  - from about 11 at % to about 21 at % Sb; and
  - from about 19 at % to about 29 at % Te.

14. The memory array of claim 11, further comprising:

a barrier electrodes disposed on the phase-change layers; and a selector layer disposed between the barrier electrode and the top electrode.

15. The memory array of claim 11, wherein the phase-change layers are doped with a dopant comprising nitrogen (N), silicon (Si), scandium (Sc), gallium (Ga), carbon (C), or any combination thereof.

16. The memory device of claim 11, wherein:

the phase-change layers have a crystallization temperature of at least 200° C.;

the top electrodes and the bottom electrodes comprise titanium nitride (TiN); and the word lines and the bit lines comprise Cu.

17. The memory device of claim 11, further comprising a dielectric layer comprising through-holes, wherein the bottom electrodes are disposed in the through-holes.

18. A memory device comprising:

a bottom electrode;

a top electrode disposed over the bottom electrode; and a phase-change layer disposed on the bottom electrode and comprising a chalcogenide germanium (Ge)-antimony (Sb)-tellurium (Te) (GST) material;

a barrier electrode disposed on the phase-change layer;

a selector layer disposed on the barrier electrode; and a top electrode disposed on the selector layer, wherein:

a Ge content of the phase change layer varies by from about 10 at % to about 30 at %, in a thickness direction extending from the top electrode to the bottom electrode; and the phase change layer has a minimum Ge content of at least 30 at %.

19. The memory device of claim 18, wherein the phase-change layer comprises:

an upper sublayer comprising a GST material that comprises from about 35 at % to about 45 at % Ge; and a lower sublayer comprising a GST material that comprises from about 55 at % to about 65 at % Ge.

20. The memory device of claim 19, wherein the upper sublayer and the lower sublayer are doped with a dopant comprising nitrogen (N), silicon (Si), scandium (Sc), gallium (Ga), carbon (C), or any combination thereof.

* * * * *